United States Patent [19]

Sega et al.

[11] Patent Number: 6,001,533
[45] Date of Patent: Dec. 14, 1999

[54] COMPOSITION FOR FORMING NON-CONDUCTIVE LIGHT-SHIELDING LAYER, AND NON-CONDUCTIVE LIGHT-SHIELDING LAYER CONTAINING SAME

[75] Inventors: Syunsuke Sega; Toshio Yoshihara; Kyoko Kogo; Junzo Nagashima, all of Tokyo-To, Japan

[73] Assignee: Dai Nippon Printing Co., Ltd., Japan

[21] Appl. No.: 08/824,553

[22] Filed: Mar. 25, 1997

[30] Foreign Application Priority Data

Mar. 27, 1996 [JP] Japan .................................. 8-095884
Sep. 13, 1996 [JP] Japan .................................. 8-263749

[51] Int. Cl.⁶ .................................................. G03C 1/73
[52] U.S. Cl. ................................. 430/270.1; 430/280.1; 430/325; 522/81
[58] Field of Search ........................... 430/270.1, 280.1, 430/325; 522/81

[56] References Cited

U.S. PATENT DOCUMENTS 5,780,201  7/1998  Sabnis et al. ........................ 430/270.1
5,814,434  9/1998  Nakamura et al. ...................... 430/25

*Primary Examiner*—Maria Nuzzolillo
*Assistant Examiner*—Laura Weiner
*Attorney, Agent, or Firm*—Parkhurst & Wendel, L.L.P.

[57] ABSTRACT

A composition for forming a non-conductive light-shielding layer, comprising an alkali-soluble binder, a pigment, a photopolymerizable monomer, a photo-polymerization initiator and a solvent, wherein the pigment comprises fine particles of a double oxide selected from $CuMn_2O_4$, and $CuMn_2O_4$ in which a part of Mn is substituted with Fe, Co and/or Ni.

12 Claims, No Drawings

COMPOSITION FOR FORMING NON-CONDUCTIVE LIGHT-SHIELDING LAYER, AND NON-CONDUCTIVE LIGHT-SHIELDING LAYER CONTAINING SAME

BACKGROUND OF THE INVENTION

1. Field of the Invention

The present invention relates to a composition for forming a light-shielding layer that has excellent light-shielding properties and which is useful in the field where non-conductivity is required. More specifically, the present invention relates to a composition for forming a non-conductive light-shielding layer, useful for making the light-shielding layer (black matrix) of a color filter to be used for liquid crystal displays or the like, to a non-conductive light-shielding layer made from the composition, and to a color filter comprising the light- shielding layer.

2. Background Art

It has conventionally been known that either a light-shielding layer comprising a thin film of a metal such as chromium, nickel or aluminum, or a light-shielding layer comprising a binder resin and a pigment such as carbon black or titanium oxide dispersed in the binder resin is provided on the non-picture-element area of a color filter useful for liquid crystal displays or the like in order to increase the contrast of images displayed.

However, the above-described conventional light-shielding layers are electrically conductive, so that they have the following problems: it is necessary to separately provide an insulating layer when either one of the light-shielding layers is provided between transparent electrode layers; the light-shielding layers tend to cause short circuiting between electrode layers; and cross talk between electrode layers which are adjacent to each other through the conductive light-shielding layer is increased. Further, in the case where a non-conductive light-shielding layer is provided by dispersing a non-conductive inorganic pigment such as titanium oxide in a binder resin, there exists such a problem that the pigment cannot be easily dispersed in the binder resin because the particle diameter of the pigment is large. In addition, the resulting light-shielding layer (coating layer) is insufficient in blackness.

An object of the present invention is therefore to provide a composition suitable for forming a light-shielding layer that is excellent in both light-shielding properties and blackness and that is not electrically conductive, and a non-conductive light-shielding layer formed from the composition.

SUMMARY OF THE INVENTION

The above object can be attained by a composition for forming a non-conductive light-shielding layer of the present invention, comprising an alkali-soluble binder, a pigment, a photopolymerizable monomer, a photopolymerization initiator and a solvent, wherein the pigment comprises fine particles of a double oxide selected from $CuMn_2O_4$, and $CuMn_2O_4$ in which a part of Mn is substituted with Fe, Co and/or Ni.

By the use of the composition of the present invention, it is possible to obtain a light-shielding layer excellent in light-shielding properties and blackness, having no conductivity.

DETAILED DESCRIPTION OF THE INVENTION

As the alkali-soluble binder for use in the composition for forming a non-conductive light-shielding layer of the present invention, a preferable binder is one that can contribute to the dispersibility of the pigment, which is highly compatible with the photopolymerizable monomer and the photopolymerization initiator, which is highly soluble in an alkaline developer and also in the organic solvent, which can show high adhesion to a substrate even when exposed especially to an alkaline developer or a cleaning fluid for many hours during the pattern-forming process including exposure and development, and whose strength, softening temperature and the like are suitable as a component of a color filter. Such a preferable binder can be selected from a wide variety of polymer materials which will be described below.

Specific examples of the polymer materials include copolymers containing a monomer having an acid radical such as a carboxyl group, for example, methacrylic, acrylic, itaconic, crotonic, maleic or partially-esterified maleic acid copolymers, and cellulose derivatives having a carboxyl group as a side chain. Further, a carboxyl-modified polymer obtained by adding a cyclic acid anhydride to a polymer having a hydroxyl group or the like serving as a site of modification can also be preferably used. In addition to these polymer materials, there can be mentioned water-soluble polymers such as polyvinyl pyrrolidone, polyethylene oxide and polyvinyl alcohol. Furthermore, there can be mentioned copolymers of an unsaturated organic acid and an unsaturated organic acid ester such as methyl acrylate, ethyl methacrylate, benzyl methacrylate or glycidyl methacrylate, and polymers obtained by addition-polymerizing other unsaturated organic acid esters in a predetermined amount to these copolymers can also be used.

In the present invention, the most preferable alkali-soluble binder is an epoxy resin, and examples thereof include a resin having reactive double bond groups which have been introduced by adding glycidyl methacrylate or the like to two or more epoxy groups in one molecule of the epoxy resin, and a modified epoxy resin which is obtained by introducing a carboxyl group by the addition of a cyclic acid anhydride to the above-described epoxy resin so as to impart thereto polymerization-initiating properties and alkali-developability. In particular, a bisphenol A-type vinyl ester whose basic skeleton is a condensation product between bisphenol A-type and epichlorohyrin is preferred as the epoxy resin. The modified epoxy resins are very excellent in pigment-dispersing properties, resistance to alkalis and adhesion to a substrate, and can impart high film strength to light-shielding layers.

Further, a light-shielding layer improved in various types of strength can be obtained by the use of the above-described epoxy resin binder which has been rendered polymerizable by introducing reactive double bond groups to at least a part of the epoxy resin binder. The average number of the reactive double bond groups to be introduced is preferably 0.1 to 20 per one molecule of the binder.

Furthermore, in order to impart suitable resistance to an alkaline developer in the light-shielding layer, it is preferable that the acid value of the epoxy resin binder be in the range of approximately 70 to 250 mg KOH/g. When the acid value of the binder is in excess of this range, although pattern resolution can be attained by subjecting the light-shielding layer to exposure and development, the resulting patterned surface tends to have small cracks because the light-shielding layer is insufficient in resistance to alkaline developer. There is therefore such a possibility that an alkaline developer rapidly penetrates into the light-shielding layer from these cracks to finally cause separation of the resist from the substrate. On the other hand, when the acid value of the binder is smaller than the above-described range, the light-shielding layer formed has decreased solubility in alkalis, so that there may be a case where even the non-exposed area of the light-shielding layer cannot be dissolved in the developer. Thus, a pattern cannot be properly formed on the light-shielding layer.

It is preferable that the molecular weight of the epoxy resin binder be in the range of 2,000 to 20,000. When the epoxy resin has a molecular weight of less than 2,000, it cannot fully function as a binder. On the other hand, when the epoxy resin has a molecular weight of more than 20,000, it tends to coagulate pigment particles and thus deteriorate the storage stability of the composition. Moreover, a light-shielding layer formed by using such an epoxy resin is poor in adhesion to a substrate, pattern-forming properties and smoothness.

The content of the epoxy resin binder is preferably 5 to 80% by weight of the total solids of the liquid composition.

Specific examples of the aforementioned epoxy resin binders include bisphenol A-type epoxy acrylates (trade name:

"VR-60", "VR-90") manufactured by Showa Highpolymer Co. Ltd., Japan; bisphenol A-type epoxy acrylates (trade name: "EB600", "EB3701") manufactured by DAICEL-UCB COMPANY, LTD., Japan; bisphenol A-type epoxy dimethacrylates (trade name: "NK Ester", "BPE-100", "BPE-200") manufactured by Shin-Nakamura Chemical Co., Ltd., Japan; and other epoxy resins such as cresol novolak epoxy acrylate and phenol novolak epoxy acrylate.

The aforementioned modified epoxy resins are sticky when their molecular weights are in the above-described preferable range of 2,000 to 20,000. Therefore, light-shielding layers formed by using such epoxy resins are sticky. If a light-shielding layer or a color filter is produced by the use of a composition for forming a non-conductive light-shielding layer, comprising such a sticky epoxy resin binder, dusts or the like easily adhere to the surface of the light-shielding layer during the production thereof, so that the resulting light-shielding layer and color filter tend to be defective. For this reason, when the epoxy resin binder is used, it is preferable to further add a high-molecular weight additive, which will be described later, to the composition so as to obtain a non-sticky light-shielding layer.

The high-molecular weight additive for use in the present invention is one that can decrease only stickiness without impairing the properties of the non-conductive light-shielding layer, such as developability and resolution. Specific examples of such an additive include graft and/or block copolymers having both a part compatible with the epoxy resin binder (hydrophilic part) and a part non-compatible with the same (hydrophobic part). When such an additive is used, the non-compatible (hydrophobic) part thereof is uniformly distributed in the non-conductive light-shielding layer. It is thus possible to eliminate only stickiness while maintaining the properties of the light-shielding layer.

Examples of the compatible (hydrophilic) part of the above-described high-molecular weight additive include high-molecular weight compounds having a hydrophilic functional group such as —OH or —COOH group, for instance, polyacrylic acid, polyvinyl pyrrolidone, polyvinyl alcohol, poly-(methacrylic acld-2-hydroxyethyl) and hydroxy-propylmethyl cellulose; and high-molecular weight compounds having an —O— bond in the main chain thereof, for instance, polyethylene glycol and polypropylene glycol. Examples of the non-compatible (hydrophobic) part of the high-molecular weight additive include polymethyl methacrylate, polystyrene and polybutene which have no hydrophilic group in their structures. These are particularly preferable in the present invention.

In the case where the high-molecular weight additive is a graft-copolymerization product, the molecular weight of the hydrophobic part of the additive is preferably in the range of 5,000 to 30,000, and that of the hydrophilic part is preferably in the range of 1,000 to 10,000. On the other hand, when the high-molecular weight additive is a block-copolymerization product, the molecular weight of the additive is preferably in the range of 5,000 to 50,000. When the high-molecular weight additive has a molecular weight lower than the above-described range, it has almost no effect on the elimination of stickiness from the light-shielding layer. On the other hand, when the high-molecular weight additive has a molecular weight higher than the above-described range, it will cause the coagulation of the pigment particles in the composition.

The above-described high-molecular weight additive can contain reactive double bond groups, or have an acid value which relates to the solubility in alkalis. The average number of reactive double bond groups to be introduced is in the range of 0.1 to 20 per one molecule of the high-molecular weight additive. The acid value of the high-molecular weight additive is preferably in the range of 10 to 250 mg KOH/g.

The high-molecular weight additive also acts as a so-called dispersion stabilizer. Namely, at least a part of the additive is adsorbed on the surfaces of the pigment particles, thereby preventing the coagulation of the pigment particles.

The above-described high-molecular weight additives can be synthesized by various known methods. They are also commercially available; for instance, there can be mentioned a comb-shaped polymer (trade name: "L-20") manufactured by Soken Chemical & Engineering Co., Ltd., Japan.

Examples of the photopolymerizable monomer for use in the composition of the present invention include mono-functional acrylates or methacrylates such as polyethylene glycol mono(meth)acrylate, polypropylene glycol mono (meth)acrylate, and phenoxyethyl (meth)acrylate; and poly-functional acrylates or methacrylates such as polyethylene glycol di(meth)acrylate, polypropylene glycol di(meth) acrylate, trimethylolethane triacrylate, trimethylolpropane triacrylate, trimethylolpropane diacrylate, neopentylglycol di(meth)acrylate, pentaerythritol tetra( meth)acrylate, pentaerythritol tri(meth)acrylate, dipentaerythritol penta-(meth) acrylate, dipentaerythritol hexaacrylate, hexanediol di(meth)acrylate, trimethylolpropane tri-(acryloyloxypropyl )ether, tri (acryloyloxyethyl) isocyanurate, tri (acryloyloxyethyl) cyanurate, glycerol tri(meth)acrylate, compounds obtained by adding ethylene oxide or propylene oxide to a poly-functional alcohol such as trimethylolpropane or glycerol, and converting the resulting addition product to (meth)acrylate, polyester acrylates, and epoxy acrylates which are reaction products between an epoxy resin and (meth)acrylic acid. Besides these monomers, pre-polymers thereof, that is, diners or trimers are also useful. The preferable amount of the monomer is in the range of 5 to 50% by weight of the total solids of the liquid composition.

In the present invention, a terpolymer of (meth)acrylic acid, styrene and benzyl (meth)acrylate can also be preferably used as the alkali-soluble binder. The copolymerization ratio of this terpolymer is not fixed, but the preferable ratio is as follows: (meth)acrylic acid is from 15 to 40% by weight, styrene is from 25 to 45% by weight, and benzyl (meth)acrylate is from 10 to 50% by weight, provided that the total is 100% by weight. Such a terpolymer also shows, together with a dispersant which will be described later, the effect of stabilizing the dispersion of the pigment in the composition of the present invention. Further, it is preferable that the acid value of the terpolymer be in the range of 70 to 250 mg KOH/g so that the terpolymer can show moderate resistance to alkali developer.

In the case where the copolymerization ratio and the acid value of the terpolymer are not within the above respective ranges, although pattern resolution can be attained by subjecting the light-shielding layer to exposure and development, the resulting patterned surface tends to have small wrinkles and cracks because the light-shielding layer is insufficient in resistance to alkali developer. There is therefore such a possibility that an alkaline developer rapidly penetrates into the light-shielding layer from these wrinkles and cracks to finally cause separation of the resist from the substrate.

The molecular weight of the above-described terpolymer binder is preferably in the range of 10,000 to 70,000. The preferable amount of the terpolymer is from 5 to 80% by weight of the total solids of the liquid composition of the invention.

In the present invention, a light-shielding layer improved in various types of strength can be obtained by the use of a polymerizable binder which can be obtained by introducing reactive double bond groups to the above-described terpolymer of (meth)acrylic acid, styrene and benzyl (meth)acrylate by allowing the terpolymer to react with glycidyl (meth)acrylate or an isocyanate compound having a vinyl or (meth)acryloyl group. It is preferable that the amount of the reactive double bond groups to be introduced be in the range of 0.1 to 20 mol %.

Examples of the photopolymerization initiator for use in the composition of the present invention include compounds of thioxantone, acetophenone, benzophenone, benzoin ether or peroxide type. It is effective to further add an amine or quinone photopolymerization promoter if it is necessary to improve the sensitivity. The amount of the photopolymerization initiator and promoter is in the range of 0.5 to 40% by weight of the total solids of the liquid composition of the invention.

The black pigment for use in the composition for forming a non-conductive light-shielding layer of the present invention is black-colored fine particles of a metallic oxide and/or sulfide, having electrical insulating properties. Examples of the black pigment include fine particles of iron oxide, chromium oxide, vanadium trioxide, vanadium dioxide, antimony trisulfide, bismuth trisulfide, chromium sulfide, molybdenum trisulfide, molybdenum disulfide, tungsten disulfide, manganese dioxide, rhenium dioxide, rhenium trioxide, rhenium disulfide, iron (II) sulfide, iron (III) sulfide, cobalt (II) oxide, cobalt (III) oxide, tricobalt tetraoxide, cobalt sulfide, nickel sulfide, and a double oxide of Cu—Mn—Fe or of Cu—Fe—Zn.

In the present invention, a preferable black pigment is formed of fine particles of a double oxide selected from $CuMn_2O_4$, and $CuMn_2O_4$ in which a part of Mn is substituted with Fe, Co and/or Ni. It has been known that these pigments are non-conductive and excellent in blackness, can be made into fine particles, have the spinel structure, and are excellent in weather resistance, heat resistance and electrical insulating properties. According to Japanese Patent Laid-Open Publication No. 50119/1992, the above inorganic pigments can be obtained in the following manner: an alkali is added to a water-soluble Cu, Mn, Fe, Co or Ni salt for neutralization and separation; an oxidizing agent such as hydrogen peroxide is added to the slurry separated to carry out oxidization in the liquid phase; and the resulting oxidate is washed, dried, calcined, and then ground to obtain the desired pigment.

By this production process, a finely-divided pigment having a large specific surface area can be obtained at low production cost. Further, when a part of Mn in the above-described double oxide $CuMn_2O_4$ is substituted with Fe, Co or Ni, a finer pigment having a larger specific surface area can be obtained. A pigment which can be preferably used in the present invention is, for example, a double oxide consisting of $CuO$, $Fe_2O_3$ and $Mn_2O_3$. It is particularly preferable that the percentage composition of this double oxide be as follows: $CuO$ is from 25 to 40% by weight, $Fe_2O_3$ is from 5 to 30% by weight, and $Mn_2O_3$ is from 40 to 60% by weight.

It is preferable that the particle diameters of these pigments be in the range of 0.01 to 0.5 $\mu$m. When the pigment has a particle diameter of smaller than 0.01 $\mu$m, the resulting light-shielding layer is insufficient in light-shielding properties. On the other hand, when the pigment has a particle diameter of larger than 0.5 $\mu$m, the resulting light-shielding layer has impaired surface smoothness, and drastically decreased accuracy in pattern formation.

The specific surface area of the pigment is preferably 15 to 25 $m^2/g$, more preferably 18 to 21 $m^2/g$. When the pigment has an excessively large specific surface area, the pigment particles tend to be coagulated, and the dispersibility of the pigment particles is thus lowered. When the pigment has an excessively small specific surface area, it has an increased specific gravity. Therefore, the pigment particles easily settle in the liquid composition, and the dispersion stability of the particles tends to become worse.

In general, many hydroxyl (OH) groups are existing on the surfaces of the fine particles of the above-described insulating pigment. For this reason, there may be caused such a trouble as the coagulation of the pigment particles or the adsorption of other components such as a binder to the surface of the pigment. It is therefore desirable to properly control the amount of the hydroxyl group existing on the surface of the pigment.

It is preferable that the amount of the hydroxyl group existing on the surface of the pigment be in the range of 0.1 to 30 $\mu$mol/g. When the amount of the hydroxyl group is in excess of 30 $\mu$mol/g, the pigment particles tend to be coagulated. On the other hand, when the amount of the hydroxyl group is less than 0.1 $\mu$mol/g, the pigment is drastically impaired in hydrophilic nature. Therefore, the pigment cannot stay in a state of being stably dispersed in the composition, and, as a result, the pigment particles are coagulated.

The amount of the hydroxyl group existing on the surface of the pigment can be determined in the following manner: 30 ml of a 0.01 N tetrabutylammonium hydroxide/ethanol solution is added to 2.0 g of the pigment, and the mixture is stirred for one hour; 30 ml of ethanol is added to 10 ml of the supernatant liquid taken from the mixture; and the value obtained by deducting the amount of tetrabutylammonium hydroxide remaining in the mixture, determined by the use of a 0.01 N perchloric acid/ethanol solution, from the amount of tetrabutylammonium hydroxide originally contained in 30 ml of the above 0.01 N tetrabutylammonium hydroxide/ethanol solution is taken as the amount of the hydroxyl group existing on the surface of the pigment.

The amount of the hydroxyl group on the surface of the pigment can be controlled to 0.1 to 30 μmol/g in the following manner. The amount of the hydroxyl group on the surface of the pigment is firstly determined in the above-described manner, and, if the amount of the hydroxyl group is too large, it can be decreased to the above range by one of the following methods: a method in which the pigment is heated at a temperature of 200° C. or higher for one hour or longer; a method in which a coupling agent having alkyl or phenyl group is added to the pigment, and allowed to react with the hydroxyl group on the surface of the pigment; and a method in which an organic compound having both a functional group such as hydroxyl group (ethylene glycol mono-n-butyl ether, etc.) or carboxyl group (phthalic anhydride, etc.) and a hydrophobic moiety is added to the pigment, and the mixture is stirred in an organic solvent by heating. On the other hand, when the amount of the hydroxyl group on the surface of the pigment is too small, one of the following methods can be employed: a method in which at least a part of the pigment is coated with ultrafine particles of a metallic oxide; and a method in which an acid or base is added to a dispersion of the pigment in water, and the mixture is boiled at a temperature of 90° C. or higher.

The above-described coupling agent which can be used in the present invention has the following general formula (I):

$$R_n\text{—}M\text{—}(OR')_{m-n} \tag{I}$$

wherein M represents a transition metal, R, which may have a reactive functional group, represents phenyl group, an alkyl group having 1 to 5 carbon atoms, or a $C_1$–$C_5$ alkylphenyl group, R' represents an alkyl group having 1 to 5 carbon atoms, m represents the valence of the metal M, and n is 1, 2 or 3.

In the above formula, M is preferably Si, Al, Ti or Zr.

Further, examples of the reactive functional group include hydroxyl, amino and epoxy groups.

The compounds represented by the above formula (I) include silane, titanate or aluminum coupling agents. From these coupling agents, a compound suitable for the previously-mentioned finely-divided pigment is selected, and used.

Examples of the silane coupling agent include
γ-(2-aminoethyl)aminopropyltrimethoxysilane,
γ-(2-aminoethyl)-aminopropyldimethoxysilane,
β-(3,4-epoxycyclohexyl)ethyl-trimethoxysilane,
γ-aminopropyltriethoxysilane,
γ-methacryloxypropyltrimethoxysilane,
N-β-(N-vinylbenzylamino-ethyl)γ-aminopropyltrimethoxysilane.
hydrochloride, γ-glycidoxypropyltrimethoxysilane, aminosilane,
γ-mercapto-propyltrimethoxysilane,
phenyltrimethoxysilane,
phenyltri-ethoxysilane, methyltrimethoxysilane,
methyltriethoxysilane, vinyltriacetoxysilane,
γ-chloropropyltrimethoxysilane, hexamethyldisilazane,
γ-anilinopropyltrimethoxysilane, vinyltrimethoxysilane,
vinyltriethoxysilane, vinyltris(β-methoxyethoxy)silane,
octadecyldimethyl [3- (trimethoxysilyl) -propyl] ammoniumchloride,
γ-chloropropylmethyldimethoxy-silane,
γ-mercaptopropylmethyldimethoxysilane,
methyl-trichlorosilane, dimethyldichlorosilane and trimethylchloro-silane.

Examples of the titanate coupling agent include
isopropyltriisostearoyltitanate,
isopropyltridecylbenzenesulfonyltitanate,
isopropyltris(dioctylpyrophosphate)titanate,
tetraisopropylbis(dioctylphosphite)titanate,
tetraoctylbis(di-tridecylphosphite)titanate,
tetra(2,2-diallyloxymethyl)bis(ditridecyl)phosphitetitanate,
bis(dioctylpyrophosphate)oxyacetatetitanate,
bis(dioctylpyrophosphate)ethylenetitanate,
isopropyltrioctanoyltitanate,
isopropyldimethacrylisostearoyltitanate,
isopropylisostearoyldiacryltitanate,
triisopropyltri(dioctylphosphate)titanate,
isopropyltricumylphosphenyltitanate,
isopropyltri(N-amidethyl aminoethyl)titanate,
dicumylphenyloxyacetatetitanate and
diisostearoylethylenetitanate.

Examples of the aluminum coupling agent include acetalkoxyaluminum diisopropionate.

The pigment can be treated with the above-described coupling agent in the following manner: for instance, the coupling agent in an amount of preferably 0.01 to 20% by weight of the pigment is added to an aqueous dispersion of the pigment, and the mixture is stirred at normal temperatures for a suitable period of time, or the mixture is heated to a temperature of 80° C. or lower, and stirred for a suitable period of time. When the coupling agent is used in an amount of less than 0.01% by weight of the pigment, the effect of the coupling agent cannot be sufficiently obtained. On the other hand, when the coupling agent is used in an amount of more then 20% by weight, the compatibility between the components of the composition becomes remarkably worse, and coagulation between the components tends to be caused.

The coupling agent can be added at any stage in the production of the composition.

Further, in the present invention, a carbonaceous powder can be incorporated into the above-described fine particles of the double oxide in order to obtain a light-shielding layer improved in light-shielding properties.

Examples of the carbonaceous powder include carbon blacks such as ketchen black, acetylene black, furnace black and channel black, natural or synthetic graphite, and short fibers such as carbon whisker, carbon fiber and graphite fiber.

When a mixture of the previously-mentioned non-conductive fine particles of the double oxide and the above-described carbonaceous powder is used, the non-conductive fine particles of the double oxide prevent the chaining of the carbonaceous powder particles, which may be caused in the light-shielding layer formed. Therefore, the light-shielding layer is to have not only excellent light-shielding properties but also non-conductivity. When the proportion of the carbonaceous powder is excessively high, the resulting light-shielding layer has conductivity. It is therefore desirable to blend 50% by weight or more of the fine particles of the double oxide with 50% by weight or less of the carbonaceous powder.

It is important that the pigment is thoroughly dispersed in the composition of the present invention. In order to improve the dispersibility of the pigment, it is possible to coat the surfaces of both of or either one of the fine particles of the double oxide and the carbonaceous powder with a hydrolyzed and/or partially-hydrolyzed metallic compound. As the hydrolyzed and/or partially-hydrolyzed metallic compound, an inorganic metallic salt, organic metallic salt, organic metallic compound or organic metallic complex, or a derivative thereof which has been hydrolyzed or partially hydrolyzed can be used. When at least a part of the surface of the carbonaceous powder is coated with such a hydrolyzed and/or partially-hydrolyzed metallic compound, not only the dispersibility of the carbonaceous powder can be improved, but also the carbonaceous powder, which is electrically conductive, can be rendered non-conductive.

As the solvent for use in the composition of the present invention, one, or two or more solvents can be selected and used by taking the coating properties of the liquid composition, the solubility of the polymer, monomer and photoinitiator, and the dispersibility of the pigment into consideration. It is preferable that at least one polyhydric alcohol or derivative thereof be contained in the solvent. Among polyhydric alcohols and derivatives thereof, those ones which have such a solubility that 200 parts by weight or more can be dissolved in 100 parts by weight of water are useful for the present invention when especially the dispersibility of the pigment is taken into consideration.

Specific examples of the solvent include ethylene glycol, ethylene glycol monomethyl ether, ethylene glycol monomethyl ether acetate, ethylene glycol monoethyl ether, ethylene glycol diethyl ether, ethylene glycol monoethyl ether acetate, ethylene glycol monobutyl ether, ethylene glycol isoamyl ether, methoxymethoxy ethanol, ethylene glycol monoacetate, diethylene glycol, diethylene glycol monomethyl ether, diethylene glycol monoethyl ether, diethylene glycol monoethyl ether acetate, diethylene glycol dimethyl ether, diethylene glycol methylethyl ether, diethylene glycol diethyl ether, propylene glycol, propylene glycol monomethyl ether, propylene glycol monomethyl ether acetate, propylene glycol monoethyl ether, 1-butoxyethoxypropanol, dipropylene glycol monomethyl ether and butanediol.

In addition to the aforementioned components, various additives such as dispersants, plasticizers and surface active agents can also be incorporated into the composition of the present invention.

With respect to the dispersants and surface active agents, although conventionally known ones can be used, it is preferable to use anionic, amphoteric or nonionic surface active agents when the surface electric potential of the pigment is taken into consideration. Specific examples of the anionic surface active agents include aliphatic or cyclic compounds having at the terminal ends thereof carboxylate, sulfuric ester, sulfonate, phosphoric ester or phosphonate group, and high-molecular surfactants such as a styrene-maleic anhydride copolymer, an olefin-maleic anhydride copolymer, a condensation product of naphthalenesulfonate with formalin, sodium polyacrylate, partially-hydrolyzed polyacrylamide, and sodium alginate can be used.

Specific examples of the amphoteric surface active agents include betaine compounds such as carboxybetaine and sulfobetaine, aminocarboxylic acid compounds, and phosphoric ester compounds. Specific examples of the nonionic surface active agents include ether compounds such as polyoxyethylene alkyl ether, polyoxyethylene alkylallyl ether and polyoxyethylene polyoxypropylene glycol, partially-esterified polyhydric alcohols such as glycerol ester, sorbitan ester and sugar ester, ether ester compounds such as polyoxyethylene ether of glycerol ester, polyoxyethylene ether of sorbitan ester and polyoxyethylene ether of sorbitol ester, and nitrogen-containing compounds such as fatty acid alkanol amide, polyoxyethylene fatty acid amide and amine oxide. Polyvinyl alcohol, polyoxyethylene ether ester copolymer, polyacryl amide and the like, which are referred to as high-molecular surfactants, can be used.

The composition of the present invention can be prepared by dispersing and blending, for instance, the aforementioned alkali-soluble binder, solvent, pigment, and, if necessary, dispersing agent by a three-roll mill, ball mill, sand mill, attritor, paint shaker or annular-type beads mill. Alternatively, the composition of the present invention can be obtained by mixing a dispersion of the pigment prepared by dispersing the pigment and dispersing agent in the solvent, with a photosensitive resin solution prepared by dissolving the alkali-soluble binder, photopolymerizable monomer and photopolymerization initiator in the solvent.

A non-conductive light-shielding layer can be formed on a substrate by coating the above composition for forming a non-conductive light-shielding layer of the present invention onto the substrate by a known means; and drying the coated layer. Specific examples of the means for coating the composition include a spinner, whirler, roll coater, curtain coater, knife coater, bar coater and extruder.

When the substrate on which the non-conductive light-shielding layer of the present invention has been formed is exposed to light, the source of light is selected depending upon the photosensitivity of the non-conductive light-shielding layer. A known light source such as an extra-high-pressure mercury vapor lamp, xenon lamp, carbon arc lamp or argon laser can be used in the present invention.

An aqueous alkaline developer is preferably used to develop the non-conductive light-shielding layer which has been subjected to pattern-wise exposure. Since the development is carried out in an aqueous system, the term "aqueous alkaline developer" as used herein means, in a narrow sense, a developer which can release $OH^-$ while development is carried out. The optimum pH of such an aqueous alkaline developer is in the range of 7.5 to 12. The alkali component of this alkaline developer is, for example, sodium hydroxide, potassium hydroxide, sodium carbonate, an organic ammonium compound such as tetraethylammonium hydroxide, a sulfide, an oxide, or a hydrolysate obtained by hydrolysis with an anionic ion (e.g., $F^-$, $CN^-$, etc.) of a weak acid. It is also possible to use a buffer solution having a pH in the above-described range as the aqueous alkaline developer.

Further, the present invention also provides a color filter, which can be obtained by a known method, comprising a transparent substrate, red, green and blue picture elements and a black matrix provided on the transparent substrate, and a transparent electrode layer provided on the picture elements and black matrix, wherein the black matrix is formed by the use of the aforementioned composition for forming a non-conductive light-shielding layer of the present invention.

The present invention will now be explained more specifically by referring to the following examples. However, the present invention is not limited to or limited by these examples.

EXAMPLE 1

(1) Preparation of Dispersion of Black Pigment

| | |
|---|---|
| TM Black #3550 (a double oxide pigment obtained by substituting a part of Mn in $CuMn_2O_4$ with Fe, manufactured by Dainichiseika Color & Chemicals Mfg. Co. Ltd., Japan) | 23% by weight |
| Disperbyk 111 (a polymeric dispersant manufactured by BYK-Chemie Japan K.K.) | 2% by weight |
| Ethylene glycol monobutyl ether | 75% by weight |

The above components were mixed, and the mixture was thoroughly dispersed by a sand mill.

(2) Preparation of Composition for Forming Non-Conductive Light-Shielding Layer

| | |
|---|---|
| Dispersion of black pigment prepared in the above (1) | 61% by weight |
| Benzyl methacrylate/styrene/-methacrylic acid copolymer (weight ratio 1/1/1, molecular weight = approx. 30,000) | 3% by weight |
| Dipentaerythritol hexaacrylate | 4% by weight |
| 2-Benzyl-2-dimethylamino-1-(4-morpholinophenyl)-butanone-1 | 1.6% by weight |
| 4,4'-Diethylaminobenzophenone | 0.3% by weight |
| 2,4-Diethylthioxanthone | 0.1% by weight |
| Ethylene glycol monobutyl ether | 30% by weight |

The above components were thoroughly mixed to obtain a composition for forming a non-conductive light-shielding layer of the present invention (3) Formation of Light-Shielding Layer The composition for forming a non-conductive light-shielding layer prepared in the above (2) was coated onto a glass substrate by a roll coater, and then dried at 100° C. for 3 minutes. A light-shielding layer having a thickness of approximately 1 µm was thus formed (4) Exposure and Development The light-shielding layer was exposed pattern-wise to an extra-high-pressure mercury vapor lamp under a stream of nitrogen, and then developed by a 1% aqueous solution of sodium carbonate.

EXAMPLE 2

(1) Preparation of Dispersion of Black Pigment

| | |
|---|---|
| TM Black #3550 (a double oxide pigment obtained by substituting a part of Mn in $CuMn_2O_4$ with Fe, manufactured by Dainichiseika Color & Chemicals Mfg. Co., Ltd., Japan) | 23% by weight |
| Disperbyk 161 (a polymeric dispersant manufactured by BYK-Chemie Japan K.K.) | 2% by weight |
| Propylene glycol monomethyl ether acetate | 75% by weight |

The above components were mixed, and the mixture was thoroughly dispersed by a paint shaker to obtain a dispersion of the black pigment.

(2) Preparation of Composition for Forming Non-Conductive Light-Shielding Layer

| | |
|---|---|
| Dispersion of black pigment prepared in the above (1) | 61% by weight |
| Benzyl methacrylate/styrene/-methacrylic acid copolymer (weight ratio 1/1/1, molecular weight = approx 20,000) | 3% by weight |
| Dipentaerythritol hexaacrylate | 4% by weight |
| 2-Benzyl-2-dimethylamino-1-(4-morpholinophenyl)-butanone-1 | 1.6% by weight |
| 4,4'-Diethylaminobenzophenone | 0.3% by weight |
| 2,4-Diethylthioxanthone | 0.1% by weight |
| Ethylene glycol monobutyl ether | 30% by weight |

The above components were thoroughly mixed to obtain a composition for forming a non-conductive light-shielding layer of the present invention.

(3) Formation of Light-Shielding Layer

The composition for forming a non-conductive light-shielding layer prepared in the above (2) was coated onto a glass substrate by a spinner, and then dried at 100° C. for 3 minutes. A light-shielding layer having a thickness of approximately 1 µm was thus formed.

(4) Exposure and Development

The light-shielding layer was exposed pattern-wise to an extra-high-pressure mercury vapor lamp under a stream of nitrogen, and then developed by a 1% aqueous solution of sodium carbonate.

EXAMPLE 3

(1) Preparation of Dispersion of Black Pigment

| | |
|---|---|
| TM Black #3550 (a double oxide pigment obtained by substituting a part of Mn in $CuMn_2O_4$ with Fe, manufactured by Dainichiseika Color & Chemicals Mfg. Co., Ltd., Japan) | 23% by weight |
| SOLSPERSE S27000 (a polymeric dispersant manufactured by ZENECA K.K., Japan) | 2% by weight |
| Ethylene glycol monomethyl ether | 75% by weight |

The above components were mixed, and the mixture was thoroughly dispersed by an annular-type beads mill to obtain a dispersion of the black pigment.

(2) Preparation of Composition for Forming Non-Conductive Light-Shielding Layer

| | |
|---|---|
| Dispersion of black pigment prepared in the above (1) | 61% by weight |
| Benzyl methacrylate/styrene/-methacrylic acid copolymer (weight ratio 1/1/1, molecular weight approx. 30,000) | 3% by weight |
| Dipentaerythritol hexaacrylate | 4% by weight |
| 2-Benzyl-2-dimethylamino-1-(4-morpholinophenyl)-butanone-1 | 1.6% by weight |
| 4,4'-Diethylaminobenzophenone | 0.3% by weight |
| 2,4-Diethylthioxanthone | 0.1% by weight |
| Ethylene glycol monomethyl ether | 30% by weight |

The above components were thoroughly mixed to obtain a composition for forming a non-conductive light-shielding layer of the present invention.

(3) Formation of Light-Shielding Layer

The composition for forming a non-conductive light-shielding layer prepared in the above (2) was coated onto a glass substrate by a bar coater, and then dried at 100° C. for 3 minutes. A light-shielding layer having a thickness of approximately 1 µm was thus formed.

(4) Exposure and Development

The light-shielding layer was exposed pattern-wise to an extra-high-pressure mercury vapor lamp under a stream of nitrogen, and then developed by a 1% aqueous solution of sodium carbonate.

EXAMPLE 4

(1) Preparation of Dispersion of Black Pigment

| | |
|---|---|
| TM Black #3550 (a double oxide pigment obtained by substituting a part of Mn in $CuMn_2O_4$ with Fe, manufactured by Dainichiseika Color & Chemicals Mfg. Co., Ltd., Japan) | 23% by weight |
| Acetalkoxyaluminum diisopropionate | 1% by weight |
| Disperbyk 111 (a polymeric dispersant manufactured by BYK-Chemie Japan K.K.) | 1% by weight |

-continued

| | |
|---|---|
| Propylene glycol monomethyl ether acetate | 75% by weight |

The above components were mixed, and the mixture was thoroughly dispersed by a paint shaker to obtain a dispersion of the black pigment.
(2) Preparation of Composition for Forming Non-Conductive

| | |
|---|---|
| Dispersion of black pigment prepared in the above (1) | 61% by weight |
| Benzyl methacrylate/styrene/-methacrylic acid copolymer (weight ratio 1/1/1, molecular weight = approx 30,000) | 3% by weight |
| Dipentaerythritol hexaacrylate | 4% by weight |
| 2-Benzyl-2-dimethylamino-1-(4-morpholinophenyl)-butanone-1 | 1.6% by weight |
| 4,4'-Diethylaminobenzophenone | 0.3% by weight |
| 2,4-Diethylthioxanthone | 0.1% by weight |
| Ethylene glycol monobutyl ether | 30% by weight |

The above components were thoroughly mixed to obtain a composition for forming a non-conductive light-shielding layer of the present invention.
(3) Formation of Light-Shielding Layer The composition for forming a non-conductive light-shielding layer prepared in the above (2) was coated onto a glass substrate by a spinner, and then dried at 100° C. for 3 minutes. A light-shielding layer having a thickness of approximately 1 μm was thus formed.
(4) Exposure and Development The light-shielding layer was exposed pattern-wise to an extra-high-pressure mercury vapor lamp under a stream of nitrogen, and then developed by a 1% aqueous solution of sodium hydroxide.

EXAMPLE 5
(1) Preparation of Dispersion of Black Pigment

| | |
|---|---|
| TM Black #3550 (a double oxide pigment obtained by substituting a part of Mn in $CuMn_2O_4$ with Fe, manufactured by Dainichiseika Color & Chemicals Mfg. Co., Ltd., Japan) | 16% by weight |
| Regal 250R (carbon black manufactured by Cablack Co., Ltd., Japan) | 7% by weight |
| Disperbyk 161 (a polymeric dispersant manufactured by BYK-Chemie Japan K.K.) | 2% by weight |
| Propylene glycol monomethyl ether acetate | 75% by weight |

The above components were mixed, and the mixture was thoroughly dispersed by a paint shaker to obtain a dispersion of the black pigment
(2) Preparation of Composition for Forming Non-Conductive Light-Shielding Layer

| | |
|---|---|
| Dispersion of black pigment prepared in the above (1) | 61% by weight |
| Dibenzyl methacrylate/styrene/-glycidyl methacrylate/acrylic acid (weight ratio 40/33/11/27, molecular weight = approx. 40,000) | 3% by weight |
| Dipentaerythritol hexaacrylate | 4% by weight |
| 2-Benzyl-2-dimethylamino-1-(4-morpholinophenyl)-butanone-1 | 1.6% by weight |
| 4,4'-Diethylaminobenzophenone | 0.3% by weight |
| 2,4-Diethylthioxanthone | 0.1% by weight |
| Ethylene glycol monobutyl ether | 30% by weight |

The above components were thoroughly mixed to obtain a composition for forming a non-conductive light-shielding layer of the present invention.
(3) Formation of Light-Shielding Layer The composition for forming a non-conductive light-shielding layer prepared in the above (2) was coated onto a glass substrate by a spinner, and then dried at 100° C. for 3 minutes. A light-shielding layer having a thickness of approximately 1 μm was thus formed.
(4) Exposure and Development The light-shielding layer was exposed pattern-wise to an extra-high-pressure mercury vapor lamp under a stream of nitrogen, and then developed by a 1% aqueous solution of sodium hydroxide.

EXAMPLE 6
(1) Preparation of Dispersion of Black Pigment

| | |
|---|---|
| TM Black #3550 (a double oxide pigment obtained by substituting a part of Mn in $CuMn_2O_4$ with Fe, manufactured by Dainichiseika Color & Chemicals Mfg. Co., Ltd., Japan) | 23% by weight |
| MA-100 (carbon black manufactured by Mitsubishi Chemical Corp., Japan) | 7% by weight |
| Acetalkoxyaluminum diisopropionate | 1% by weight |
| Disperbyk 111 (a polymeric dispersant manufactured by BYK-Chemie Japan K.K.) | 1% by weight |
| Propylene glycol monomethyl ether acetate | 68% by weight |

The above components were mixed, and the mixture was thoroughly dispersed by a sand mill to obtain a dispersion of the black pigment.
(2) Preparation of Composition for Forming Non-Conductive Light-Shielding Layer

| | |
|---|---|
| Dispersion of black pigment prepared in the above (1) | 61% by weight |
| Benzyl methacrylate/styrene/-glycidyl methacrylate/acrylic acid (weight ratio 40/33/11/27, molecular weight = approx. 30,000) | 3% by weight |
| 2-Benzyl-2-dimethylamino-1-(4-morpholinophenyl)-butanone-1 | 1.6% by weight |
| 4,4'-Diethylaminobenzophenone | 0.3% by weight |
| 2,4-Diethylthioxanthone | 0.1% by weight |
| Ethylene glycol monobutyl ether | 30% by weight |

The above components were thoroughly mixed to obtain a composition for forming a non-conductive light-shielding layer of the present invention.
(3) Formation of Light-Shielding Layer The composition for forming a non-conductive light-shielding layer prepared in the above (2) was coated onto a glass substrate by a spinner, and then dried at 100° C. for 3 minutes. A light-shielding layer having a thickness of approximately 1 μm was thus formed.
(4) Exposure and Development The light-shielding layer was exposed pattern-wise to an extra-high-pressure mercury vapor lamp under a stream of nitrogen, and then developed by a 1% aqueous solution of sodium hydroxide.

EXAMPLE 7

(1) Preparation of Dispersion of Black Pigment

| | |
|---|---|
| TM Black #3550 (a double oxide pigment obtained by substituting a part of Mn in $CuMn_2O_4$ with Fe, manufactured by Dainichiseika Color & Chemicals Mfg. Co., Ltd., Japan) | 23% by weight |
| Disperbyk 111 (a polymeric dispersant manufactured by BYK-Chemie Japan K.K.) | 2% by weight |
| Ethylene glycol monobutyl ether | 75% by weight |

The above components were mixed, and the mixture was thoroughly dispersed by a sand mill to obtain a dispersion of the black pigment.

(2) Preparation of Composition for Forming Non-Conductive Light-Shielding Layer

| | |
|---|---|
| Dispersion of black pigment prepared in the above (1) | 61% by weight |
| Addition product of benzyl methacrylate/styrene/methacrylic acid copolymer (weight ratio 1/1/1, molecular weight = approx. 30,000) with 7.3 mol % of glycidyl methacrylate | 3% by weight |
| Dipentaerythritol hexaacrylate | 4% by weight |
| 2-Benzyl-2-dimethylamino-1-(4-morpholinophenyl)-butanone-1 | 1.6% by weight |
| 4,4'-Diethylaminobenzophenone | 0.3% by weight |
| 2,4-Diethylthioxanthone | 0.1% by weight |
| Ethylene glycol monobutyl ether | 30% by weight |

The above components were thoroughly mixed to obtain a composition for forming a non-conductive light-shielding layer of the present invention.

(3) Formation of Light-Shielding Layer

The composition for forming a non-conductive light-shielding layer prepared in the above (2) was coated onto a glass substrate by a roll coater, and then dried at 100° C. for 3 minutes. A light-shielding layer having a thickness of approximately 1 μm was thus formed.

(4) Exposure and Development

The light-shielding layer was exposed pattern-wise to an extra-high-pressure mercury vapor lamp under a stream of nitrogen, and then developed by a 1% aqueous solution of sodium hydroxide.

EXAMPLE 8

(1) Preparation of Dispersion of Black Pigment

| | |
|---|---|
| TM Black #3550 (a double oxide pigment obtained by substituting a part of Mn in $CuMn_2O_4$ with Fe, manufactured by Dainichiseika Color & Chemicals Mfg. Co., Ltd., Japan) | 23% by weight |
| Disperbyk 111 (a polymeric dispersant manufactured by BYK-Chemie Japan K.K.) | 2% by weight |
| Ethylene glycol monobutyl ether | 75% by weight |

The above components were mixed, and the mixture was thoroughly dispersed by a sand mill to obtain a dispersion of the black pigment.

(2) Preparation of Composition for Forming Non-Conductive Light-Shielding Layer

| | |
|---|---|
| Dispersion of black pigment prepared in the above (1) | 61% by weight |
| Addition product of benzyl methacrylate/styrene/methacrylic acid copolymer (weight ratio 4/3/3, molecular weight = approx. 30,000) with 7.5 mol % of glycidyl methacrylate | 3% by weight |
| Dipentaerythritol hexaacrylate | 4% by weight |
| 2-Benzyl-2-dimethylamino-1-(4-morpholinophenyl)-butanone-1 | 1.6% by weight |
| 4,4'-Diethylaminobenzophenone | 0.3% by weight |
| 2,4-Diethylthioxanthone | 0.1% by weight |
| Ethylene glycol monobutyl ether | 30% by weight |

The above components were thoroughly mixed to obtain a composition for forming a non-conductive light-shielding layer of the present invention.

(3) Formation of Light-Shielding Layer

The composition for forming a non-conductive light-shielding layer prepared in the above (2) was coated onto a glass substrate by a roll coater, and then dried at 100° C. for 3 minutes. A light-shielding layer having a thickness of approximately 1 μm was thus formed.

(4) Exposure and Development

The light-shielding layer was exposed pattern-wise to an extra-high-pressure mercury vapor lamp under a stream of nitrogen, and then developed by a 1% aqueous solution of sodium hydroxide.

EXAMPLE 9

(1) Preparation of Dispersion of Black Pigment

| | |
|---|---|
| TM Black #3550 (a double oxide pigment obtained by substituting a part of Mn in $CuMn_2O_4$ with Fe, manufactured by Dainichiseika Color & Chemicals Mfg. Co., Ltd., Japan) | 23% by weight |
| Disperbyk 111 (a polymeric dispersant manufactured by BYK-Chemie Japan K.K.) | 2% by weight |
| Ethylene glycol monobutyl ether | 75% by weight |

The above components were mixed, and the mixture was thoroughly dispersed by a sand mill to obtain a dispersion of the black pigment.

(2) Preparation of Composition for Forming Non-Conductive Light-Shielding Layer

| | |
|---|---|
| Dispersion of black pigment prepared in the above (1) | 61% by weight |
| Addition product of benzyl methacrylate/styrene/methacrylic acid copolymer (weight ratio 4/4/2, molecular weight = approx. 30,000) with 7.5 mol% of glycidyl methacrylate | 3% by weight |
| Dipentaerythritol hexaacrylate | 4% by weight |
| 2-Benzyl-2-dimethylamino-1-(4-morpholinophenyl)-butanone-1 | 1.6% by weight |
| 4,4'-Diethylaminobenzophenone | 0.3% by weight |
| 2,4-Diethylthioxanthone | 0.1% by weight |
| Ethylene glycol monobutyl ether | 30% by weight |

The above components were thoroughly mixed to obtain a composition for forming a non-conductive light-shielding layer of the present invention.

(3) Formation of Light-Shielding Layer

The composition for forming a non-conductive light-shielding layer prepared in the above (2) was coated onto a glass substrate by a roll coater, and then dried at 100° C. for 3 minutes. A light-shielding layer having a thickness of approximately 1 μm was thus formed.

(4) Exposure and Development

The light-shielding layer was exposed pattern-wise to an extra-high-pressure mercury vapor lamp under a stream of nitrogen, and then developed by a 1% aqueous solution of sodium hydroxide.

COMPARATIVE EXAMPLE 1

A patterned light-shielding layer was obtained in the same manner as in Example 2 except that only carbon black was used as the pigment as shown in the following formulation.

(1) Preparation of Dispersion of Black Pigment

| | |
|---|---|
| Regal 250R (carbon black manufactured by Cablack Co., Ltd., Japan) | 23% by weight |
| Disperbyk 161 (a polymeric dispersant manufactured by BYK-Chemie Japan K.K.) | 2% by weight |
| Propylene glycol monomethyl ether acetate | 75% by weight |

The above components were mixed, and the mixture was thoroughly dispersed by a paint shaker to obtain a dispersion of the black pigment.

(2) Preparation of Composition for Forming Non-Conductive Light-Shielding Layer

| | |
|---|---|
| Dispersion of black pigment prepared in the above (1) | 38% by weight |
| Benzyl methacrylate/styrene/-methacrylic acid copolymer (weight ratio 1/1/1, molecular weight = approx. 30,000) | 5% by weight |
| Dipentaerythritol hexaacrylate | 3% by weight |
| 2-Benzyl-2-dimethylamino-1-(4-morpholinophenyl)-butanone-1 | 1.6% by weight |
| 4,4'-Diethylaminobenzophenone | 0.3% by weight |
| 2,4-Diethylthioxanthone | 0.1% by weight |
| Ethylene glycol monobutyl ether | 52% by weight |

The above components were thoroughly mixed to obtain a comparative composition for forming a non-conductive light-shielding layer.

By the use of the above-obtained comparative composition for forming a non-conductive light-shielding layer, a light-shielding layer was formed in the same manner as in (3) and (4) of Example 2.

The volume resistivities of the above-obtained light-shielding layers of the present invention and comparative light-shielding layer were measured. The results are shown in Table 1.

TABLE 1

| Sample | Volume Resistivity (ohm cm) |
|---|---|
| Example 1 | $10^{12}$ |
| Example 2 | $10^{12}$ |
| Example 3 | $10^{12}$ |
| Example 4 | $10^{12}$ |
| Example 5 | $10^{9}$ |
| Example 6 | $10^{10}$ |
| Example 7 | $10^{12}$ |
| Example 8 | $10^{12}$ |

TABLE 1-continued

| Sample | Volume Resistivity (ohm cm) |
|---|---|
| Example 9 | $10^{12}$ |
| Comp. Example 1 | $10^{6}$ |

The data shown in Table 1 clearly demonstrate that the light-shielding layers made from the compositions of the present invention are remarkably superior to the conventional light-shielding layer (Comparative Example 1) in non-conductivity.

EXAMPLE 10

(1) Preparation of Dispersion (a) of Black Pigment Non-conductive black pigment:

| | |
|---|---|
| Non-conductive black pigment: TM Black #9550 (fine particles of a double oxide obtained by substituting a part of Mn in $CuMn_2O_4$ with Fe (amount of hydroxyl group: 4.23 μ mol/g), manufactured by Dainichiseika Color & Chemicals Mfg. Co., Ltd., Japan) | 23 parts by weight |
| Dispersant: Disperbyk 111 (a polymeric dispersant manufactured by BYK-Chemie Japan K.K.) | 2 parts by weight |
| Ethylene glycol monobutyl ether | 75 parts by weight |

The above components were mixed, and the mixture was thoroughly dispersed by a sand mill to obtain a dispersion (a) of the black pigment.

(2) Preparation of Composition for Forming Non-Conductive Light-Shielding Layer

| | |
|---|---|
| Dispersion (a) of black pigment | 61 parts by weight |
| Alkali-soluble binder: VR-60 (Bisphenol A-type epoxy acrylate, manufactured by Showa Highpolymer Co., Ltd., Japan) | 2.8 parts by weight |
| Photopolymerizable monomer: | |
| Dipentaerythritol pentaacrylate | 3.5 parts by weight |
| High-molecular weight additive: L-20 (a comb-shaped polymer manufactured by Soken Chemical & Engineering Co., Ltd., Japan) | 0.7 parts by weight |
| Photopolymerization initiators: | |
| 2-Benzyl-2-dimethylamino-1-(4-morpholinophenyl)-butanone-1 | 1.6 parts by weight |
| 4,4-Diethylthioxanthone | 0.3 parts by weight |
| 2,4-Diethylthioxanthone | 0.1 parts by weight |
| Ethylene glycol monobutyl ether | 30 parts by weight |

The above components were thoroughly mixed to obtain a composition A for forming a non-conductive light-shielding layer.

(3) Formation of Light-Shielding Layer

The composition A for forming a non-conductive light-shielding layer prepared in the above (2) was coated onto a glass substrate by a roll coater, and then dried at 100° C. for 3 minutes. A light-shielding layer having a thickness of approximately 1 μm was thus formed.

(4) Exposure and Development

The non-conductive light-shielding layer was exposed pattern-wise to an extra-high-pressure mercury vapor lamp under a stream of nitrogen, and then developed by a 1% aqueous solution of sodium carbonate.

EXAMPLE 11

(1) Preparation of Dispersion of Black Pigment

A dispersion (a) of the black pigment was prepared in the same manner as in Example 1.

(2) Preparation of Composition for Forming Non-Conductive Light-Shielding Layer

| | |
|---|---|
| Dispersion (a) of black pigment | 61 parts by weight |
| Alkali-soluble binder-VR-60 | 2.8 parts by weight |
| (Bisphenol A-type epoxy acrylate, manufactured by Showa Highpolymer Co., Ltd., Japan) | |
| Photopolymerizable monomer: | |
| Dipentaerythritol hexaacrylate | 2.8 parts by weight |
| NK Ester A-BPE-20 | 0.7 parts by weight |
| (Bisphenol A-type/ethylene oxide addition product, manufactured by Shin-Nakamura Chemical Co., Ltd. Japan) | |
| High-molecular weight additive: | |
| L-20 | 0.7 parts by weight |
| (a comb-shaped polymer manufactured by Soken Chemical & Engineering Co., Ltd., Japan) | |
| Photopolymerization initiators: | |
| 2-Benzyl-2-dimethylamino-1-(4-morpholinophenyl)-butanone-1 | 1.6 parts by weight |
| 4,4-Diethylthioxanthone | 0.3 parts by weight |
| 2,4-Diethylthioxanthone | 0.1 parts by weight |
| Ethylene glycol monobutyl ether | 30 parts by weight |

The above components were thoroughly mixed to obtain a composition B for forming a non-conductive light-shielding layer.

(3) Formation of Light-Shielding Layer

The composition B for forming a non-conductive light-shielding layer prepared in the above (2) was coated onto a glass substrate by a roll coater, and then dried at 100° C. for 3 minutes. A light-shielding layer having a thickness of approximately 1 μm was thus formed.

(4) Exposure and Development

The non-conductive light-shielding layer was exposed pattern-wise to an extra-high-pressure mercury vapor lamp under a stream of nitrogen, and then developed by a 1% aqueous solution of sodium carbonate.

EXAMPLE 12

(1) Introduction of Hydrophobic Group to Surface of Non-Conductive Black Pigment

| | |
|---|---|
| Non-conductive black pigment: | |
| TM Black #9550 | 30% by weight |
| (fine particles of a double oxide obtained by substituting a part of Mn in $CuMn_2O_4$ with Fe, manufactured by Dainichiseika Color & Chemicals Mfg. Co., Ltd., Japan) | |
| Phenyltriethoxysilane | 0.3 parts by weight |
| Ethylene glycol monobutyl ether | 270 parts by weight |

The above components were stirred at 120° C. for 8 hours to introduce phenyl group to the surface of the black pigment. The amount of the phenyl group introduced was 3 μmol/g (⅓ of the total amount of polar groups on the non-conductive black pigment).

(2) Preparation of Dispersion of Black Pigment

| | |
|---|---|
| The above non-conductive black pigment | 23 parts by weight |
| Dispersant: Disperbyk 111 | 2 parts by weight |
| (a polymeric dispersant manufactured by BYK-Chemie Japan K.K.) | |
| Ethylene glycol monobutyl ether | 75 parts by weight |

The above components were mixed, and the mixture was thoroughly dispersed by a sand mill.

(3) Preparation of Composition for Forming Non-Conductive Light-Shielding Layer

| | |
|---|---|
| Dispersion of black pigment prepared in the above (2) | 61 parts by weight |
| Alkali-soluble binder: VR-60 | 2.8 parts by weight |
| (Bisphenol A-type epoxy acrylate, manufactured by Showa Highpolymer Co., Ltd., Japan) | |
| Photopolymerizable monomer: | |
| Dipentaerythritol pentaacrylate | 3.5 parts by weight |
| High-molecular weight additive: | |
| L-20 | 0.7 parts by weight |
| (a comb-shaped polymer manufactured by Soken Chemical & Engineering Co., Ltd., Japan) | |
| Photopolymerization initiators: | |
| 2-Benzyl-2-dimethylamino-1-(4-morpholinophenyl)-butanone-1 | 1.6 parts by weight |
| 4,4-Diethylthioxanthone | 0.3 parts by weight |
| 2,4-Diethylthioxanthone | 0.1 parts by weight |
| Ethylene glycol monobutyl ether | 30 parts by weight |

The above components were thoroughly mixed to obtain a composition for forming a non-conductive light-shielding layer of the present invention.

(4) Formation of Light-Shielding Layer

The composition for forming a non-conductive light-shielding layer prepared in the above (2) was coated onto a glass substrate by a roll coater, and then dried at 100° C. for 3 minutes. A light-shielding layer having a thickness of approximately 1 μm was thus formed.

(5) Exposure and Development

The light-shielding layer was exposed pattern-wise to an extra-high-pressure mercury vapor lamp under a stream of nitrogen, and then developed by a 1% aqueous solution of sodium carbonate.

EXAMPLE 13

(1) Introduction of Hydrophobic Group to Surface of Non-Conductive Black Pigment

| | |
|---|---|
| Non-conductive black pigment: | |
| TM Black #9550 | 30% by weight |
| (fine particles of a double oxide obtained by substituting a part of Mn in $CuMn_2O_4$ with Fe, manufactured by Dainichiseika Color & Chemicals Mfg. Co., Ltd., Japan) | |
| Methyltriethoxysilane | 0.3 parts by weight |
| Ethylene glycol monobutyl ether | 270 parts by weight |

The above components were stirred at 120° C. for 8 hours to introduce methyl group to the surface of the black pigment. The amount of the methyl group introduced was 3 μmol/g (⅓ of the total amount of polar groups on the non-conductive black pigment).

(2) Preparation of Dispersion of Black Pigment

A dispersion of the black pigment was prepared in the same manner as in Example 12.

(3) Preparation of Composition for Forming Non-Conductive Light-Shielding Layer

A composition for forming a non-conductive light-shielding layer was prepared in the same manner as in Example 12.

(4) Formation of Light-Shielding Layer

The composition for forming a non-conductive light-shielding layer prepared in the above (2) was coated onto a glass substrate by a roll coater, and then dried at 100° C. for 3 minutes. A light-shielding layer having a thickness of approximately 1 μm was thus formed.

(5) Exposure and Development

The light-shielding layer was exposed pattern-wise to an extra-high-pressure mercury vapor lamp under a stream of nitrogen, and then developed by a 1% aqueous solution of sodium carbonate.

EXAMPLE 14

(1) Introduction of Hydrophobic Group to Surface of Non-Conductive Black Pigment

| | |
|---|---|
| Non-conductive black pigment; SICOCER F Black 2912 (fine particles of Cu—Fe—Zn double oxide, manufactured by BASF CORPORATION) | 30 parts by weight |
| Phenyltriethoxysilane | 0.3 parts by weight |
| Ethylene glycol monobutyl ether | 270 parts by weight |

The above components were stirred at 120° C. for 8 hours to introduce phenyl group to the surface of the black pigment. The amount of the phenyl group introduced was 4 μmol/g.

(2) Preparation of Dispersion of Black Pigment A dispersion of the black pigment was prepared in the same manner as in Example 12.

(3) Preparation of Composition for Forming Non-Conductive Light-Shielding Layer

A composition for forming a non-conductive light-shielding layer was prepared in the same manner as in Example 12.

(4) Formation of Light-Shielding Layer

The composition for forming a non-conductive light-shielding layer prepared in the above (2) was coated onto a glass substrate by a roll coater, and then dried at 100° C. for 3 minutes. A light-shielding layer having a thickness of approximately 1 μm was thus formed.

(5) Exposure and Development

The light-shielding layer was exposed pattern-wise to an extra-high-pressure mercury vapor lamp under a stream of nitrogen, and then developed by a 1% aqueous solution of sodium carbonate.

EXAMPLE 15

(1) Introduction of Hydrophobic Group to Surface of Non-Conductive Black Pigment

| | |
|---|---|
| Non-conductive black pigment: PA-8464M (fine particles of an iron oxide compound, manufactured by Sakai Kagaku Kogyo K.K., Japan) | 30% by weight |
| Phenyltriethoxysilane | 0.3 parts by weight |
| Ethylene glycol monobutyl ether | 270 parts by weight |

The above components were stirred at 120° C. for 8 hours to introduce phenyl group to the surface of the black pigment. The amount of the phenyl group introduced was 3 μmol/g.

(2) Preparation of Dispersion of Black Pigment

A dispersion of the black pigment was prepared in the same manner as in Example 12.

(3) Preparation of Composition for Forming Non-Conductive Light-Shielding Layer

A composition for forming a non-conductive light-shielding layer was prepared in the same manner as in Example 12.

(4) Formation of Light-Shielding Layer

The composition for forming a non-conductive light-shielding layer prepared in the above (2) was coated onto a glass substrate by a roll coater, and then dried at 100° C. for 3 minutes. A light-shielding layer having a thickness of approximately 1 μm was thus formed.

(5) Exposure and Development

The light-shielding layer was exposed pattern-wise to an extra-high-pressure mercury vapor lamp under a stream of nitrogen, and then developed by a 1% aqueous solution of sodium carbonate.

EXAMPLE 16

(1) Preparation of Dispersion of Black Pigment

| | |
|---|---|
| Non-conductive black pigment: TM Black #9550 (fine particles of a double oxide obtained by substituting a part of Mn in $CuMn_2O_4$ with Fe, manufactured by Dainichiseika Color & Chemicals Mfg. Co., Ltd., Japan) | 23 parts by weight |
| Phenyltriethoxysilane | 0.2 parts by weight |
| Dispersant: Disperbyk 111 (a polymeric dispersant manufactured by BYK-Chemie Japan K.K.) | 1.6 parts by weight |
| Ethylene glycol monobutyl ether | 75 parts by weight |

The above components were mixed, and the mixture was thoroughly dispersed by a sand mill.

(2) Preparation of Composition for Forming Non-Conductive Light-Shielding Layer

| | |
|---|---|
| Dispersion of black pigment prepared in the above (1) | 61 parts by weight |
| Alkali-soluble binder: VR-60 (Bisphenol A-type epoxy acrylate, manufactured by Showa Highpolymer Co., Ltd., Japan) | 2.8 parts by weight |
| Photopolymerizable monomer: Dipentaerythritol pentaacrylate | 3.5 parts by weight |
| High-molecular weight additive: L-20 (a comb-shaped polymer manufactured by Soken Chemical & Engineering Co., Ltd., Japan) | 0.7 parts by weight |
| Photopolymerization initiators: | |
| 2-Benzyl-2-dimethylamino-1-(4-morpholinophenyl)-butanone-1 | 1.6 parts by weight |
| 4,4-Diethylthioxanthone | 0.3 parts by weight |
| 2,4-Diethylthioxanthone | 0.1 parts by weight |
| Ethylene glycol monobutyl ether | 30 parts by weight |

The above components were thoroughly mixed to obtain a composition for forming a non-conductive light-shielding layer of the present invention.

(3) Formation of Light-Shielding Layer

The composition for forming a non-conductive light-shielding layer prepared in the above (2) was coated onto a glass substrate by a roll coater, and then dried at 100° C. for 3 minutes. A light-shielding layer having a thickness of approximately 1 μm was thus formed.

(4) Exposure and Development

The light-shielding layer was exposed pattern-wise to an extra-high-pressure mercury vapor lamp under a stream of nitrogen, and then developed by a 1% aqueous solution of sodium carbonate.

EXAMPLE 17
(1) Preparation of Dispersion of Black Pigment

| | |
|---|---|
| Non-conductive black pigment: | |
| TM Black #9550 | 23 parts by weight |
| (fine particles of a double oxide obtained by substituting a part of Mn in $CuMn_2O_4$ with Fe, manufactured by Dainichiseika Color & Chemicals Mfg. Co., Ltd., Japan) | |
| Methyltriethoxysilane | 0.2 parts by weight |
| Dispersant: Disperbyk 111 | 1.8 parts by weight |
| (a polymeric dispersant manufactured by BYK-Chemie Japan K.K.) | |
| Ethylene glycol monobutyl ether | 75 parts by weight |

The above components were mixed, and the mixture was thoroughly dispersed by a sand mill.

(2) Preparation of Composition for Forming Non-Conductive Light-Shielding Layer

A composition for forming a non-conductive light-shielding layer was prepared in the same manner as in Example 1.

(3) Formation of Light-Shielding Layer

The composition for forming a non-conductive light-shielding layer prepared in the above (2) was coated onto a glass substrate by a roll coater, and then dried at 100° C. for 3 minutes. A light-shielding layer having a thickness of approximately 1 μm was thus formed.

(4) Exposure and Development

The light-shielding layer was exposed pattern-wise to an extra-high-pressure mercury vapor lamp under a stream of nitrogen, and then developed by a 1% aqueous solution of sodium carbonate.

EXAMPLE 18
(1) Preparation of Dispersion of Black Pigment

| | |
|---|---|
| Non-conductive black pigment: | |
| SICOCER F Black 2912 | 23 parts by weight |
| (fine particles of Cu—Fe—Zn double oxide, manufactured by BASF CORPORATION) | |
| Phenyltriethoxysilane | 0.2 parts by weight |
| Dispersant: Disperbyk 111 | 1.8 parts by weight |
| Ethylene glycol monobutyl ether | 75 parts by weight |

The above components were mixed, and the mixture was thoroughly dispersed by a sand mill.

(2) Preparation of Composition for Forming Non-Conductive Light-Shielding Layer

A composition for forming a non-conductive light-shielding layer was prepared in the same manner as in Example 1.

(3) Formation of Light-Shielding Layer

The composition for forming a non-conductive light-shielding layer prepared in the above (2) was coated onto a glass substrate by a roll coater, and then dried at 100° C. for 3 minutes. A light-shielding layer having a thickness of approximately 1 μm was thus formed (4) Exposure and Development The light-shielding layer was exposed pattern-wise to an extra-high-pressure mercury vapor lamp under a stream of nitrogen, and then developed by a 1% aqueous solution of sodium carbonate.

The compositions and light-shielding layers obtained in Examples 10 to 18 were tested in terms of the following properties. The results are as follows.

(a) Change of Composition for Forming Non-Conductive Light-Shielding Layer with Time No change was found in either the viscosity or the particle size distribution of any one of the compositions for forming non-conductive light-shielding layers (b) Smoothness of Light-Shielding Layer The non-conductive light-shielding layers were found to be completely smooth.

(c) Adhesion of Light-Shielding Layer to Substrate during Development and Washing Neither peeling nor falling of the non-conductive light-shielding layers was found while they were developed and washed.

(d) Patterning Properties

A pattern with a line-space width of 8 to 40 μm was formed on each one of the non-conductive light-shielding layers obtained in Examples 10 to 18. A pattern with a line-space width of 12 μm or wider was able to be perfectly formed on the light-shielding layers of Examples 10 and 11. However, a pattern with a line-space width of narrower than 12 μm formed on each one of these light-shielding layers was found to be imperfect. On the other hand, it was possible to form even a pattern with a line-space width of 8 μm on the light-shielding layers of Examples 12 to 18, comprising a coupling agent. From the practical point of view, it is sufficient that a pattern with a line-space width of approximately 16 μm can be perfectly formed on a light-shielding layer. It was however found that it is preferable to incorporate a coupling agent into a light-shielding layer in order to form thereon a more minute pattern.

What is claimed is:

1. A composition for forming a non-conductive light-shielding layer, comprising an alkali-soluble binder, a pigment, a photopolymerizable monomer, a photopolymerization initiator and a solvent, wherein the pigment comprises fine particles of a double oxide selected from $CuMn_2O_4$, and $CuMn_2O_4$ in which a part of Mn is substituted with Fe, Co and/or Ni.

2. The composition according to claim 1, wherein at least a part of the surfaces of the fine particles of the double oxide are coated with a hydrolyzed or partially-hydrolyzed inorganic metallic salt, organic metallic salt, organic metallic compound or organic metallic complex.

3. The composition according to claim 1, wherein the surfaces of the fine particles of the double oxide have 0.1 to 30 μmol/g of hydroxyl groups thereon.

4. The composition according to claim 3, wherein the fine particles of the double oxide have been treated with a coupling agent represented by the following general formula (I):

$$R_n—M—(OR')_{m-n} \qquad (I)$$

wherein M represents a transition metal; R, which may have a reactive functional group, represents phenyl group, an alkyl group having 1 to 5 carbon atoms, or a $C_1$–$C_5$ alkylphenyl group; R' represents an alkyl group having 1 to 5 carbon atoms; m represents a valence of the metal M; and n is 1, 2 or 3.

5. The composition according to claim 1, wherein the fine particles of the double oxide have a specific surface area of 15 to 25 $m^2/g$.

6. The composition according to claim 1, wherein the alkali-soluble binder is an epoxy resin containing functional groups having reactive double bonds, the average number of the functional groups being from 0.1 to 20 per one molecule of the epoxy resin.

7. The composition according to claim 6, wherein the epoxy resin has an acid value of 70 to 250 mg KOH/g.

8. The composition according to claim 6, wherein the epoxy resin is a bisphenol A vinyl ester.

9. The composition according to claim 6, further comprising a high-molecular weight additive selected from graft copolymers consisting of a hydrophobic main chain and hydrophilic side chains, graft copolymers consisting of a hydrophilic main chain and hydrophobic side chains, and block copolymers consisting of a hydrophobic block and a hydrophilic block.

10. The composition according to claim 9, wherein the high-molecular weight additive contains functional groups having reactive double bonds, the average number of the functional groups being from 0.1 to 20 per one molecule of the high-molecular weight additive.

11. The composition according to claim 9, wherein the high-molecular weight additive has an acid value of 10 to 250 mg KOH/g.

12. A non-conductive light-shielding layer formed by coating the composition of claim 1 onto a substrate, drying the layer formed on the substrate, and subjecting the dried layer to the process of forming a pattern, including exposure and development.

* * * * *

UNITED STATES PATENT AND TRADEMARK OFFICE
CERTIFICATE OF CORRECTION

PATENT NO. : 6,001,533
DATED : December 14, 1999
INVENTOR(S) : Syunsuke SEGA et al.

It is certified that error appears in the above-identified patent and that said Letters Patent is hereby corrected as shown below:

On the title page, Item [54], change "COMPOSITION FOR FORMING NON-CONDUCTIVE LIGHT-SHIELDING LAYER, AND NON-CONDUCTIVE LIGHT-SHIELDING LAYER CONTAINING SAME" to -- COMPOSITION FOR FORMING NON-CONDUCTIVE LIGHT-SHIELDING LAYER, AND NON-CONDUCTIVE LIGHT-SHIELDING LAYER AND COLOR FILTER CONTAINING SAME--.

Signed and Sealed this

Twenty-first Day of November, 2000

Q. TODD DICKINSON

*Attest:*

*Attesting Officer*  *Director of Patents and Trademarks*